US011164903B2

(12) United States Patent
Tung et al.

(10) Patent No.: US 11,164,903 B2
(45) Date of Patent: Nov. 2, 2021

(54) IMAGE SENSOR WITH PAD STRUCTURE

(71) Applicant: TAIWAN SEMICONDUCTOR MANUFACTURING CO., LTD., Hsinchu (TW)

(72) Inventors: Huai-jen Tung, Tainan (TW); Ching-Chung Su, Tainan (TW); Keng-Ying Liao, Tainan (TW); Po-Zen Chen, Tainan (TW); Su-Yu Yeh, Tainan (TW); S. Y. Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 32 days.

(21) Appl. No.: 16/422,271

(22) Filed: May 24, 2019

(65) Prior Publication Data

US 2020/0373344 A1    Nov. 26, 2020

(51) Int. Cl.
*H01L 27/146*    (2006.01)
*H01L 23/00*    (2006.01)

(52) U.S. Cl.
CPC ........ *H01L 27/14636* (2013.01); *H01L 24/03* (2013.01); *H01L 24/05* (2013.01);
(Continued)

(58) Field of Classification Search
CPC ..................... H01L 27/14636; H01L 27/1464
See application file for complete search history.

(56) References Cited

U.S. PATENT DOCUMENTS 8,405,182 B2    3/2013   Chou et al.
8,796,805 B2    8/2014   Ting et al.
(Continued)

FOREIGN PATENT DOCUMENTS

CN    107293529 A    10/2017
JP    2010212735 A    9/2010
(Continued)

OTHER PUBLICATIONS

Korean Office Action, dated Feb. 1, 2021, for Korean Intellectual Property Office Appl. No. 10-2019-0102217, 8 pages.
(Continued)

*Primary Examiner* — Sarah K Salerno
(74) *Attorney, Agent, or Firm* — Sterne, Kessler, Goldstein & Fox P.L.L.C.

(57) ABSTRACT

The present disclosure describes the formation of a pad structure in an image sensor device using a sacrificial isolation region and a silicon oxide based stack with no intervening nitride etch-stop layers. The image sensor device includes a semiconductor layer comprising a first horizontal surface opposite to a second horizontal surface; a metallization layer formed on the second horizontal surface of the semiconductor layer, where the metallization layer includes a dielectric layer. The image sensor device also includes a pad region traversing through the semiconductor layer from the first horizontal surface to the second horizontal surface. The pad region includes an oxide layer with no intervening nitride layers formed on the dielectric layer of the metallization layer and a pad structure in physical contact with a conductive structure of the metallization layer.

20 Claims, 15 Drawing Sheets

(52) U.S. Cl.
CPC .......... *H01L 24/06* (2013.01); *H01L 27/1463* (2013.01); *H01L 27/1464* (2013.01); *H01L 27/14634* (2013.01); *H01L 27/14683* (2013.01); *H01L 2224/04042* (2013.01); *H01L 2224/06155* (2013.01)

(56) References Cited

U.S. PATENT DOCUMENTS

| | | | |
|---|---|---|---|
| 10,224,769 B2 | 3/2019 | Yamagishi | |
| 10,270,003 B2 | 4/2019 | Cheng | |
| 10,453,886 B2 | 10/2019 | Takahashi et al. | |
| 10,734,429 B2 | 8/2020 | Cheng et al. | |
| 2011/0233702 A1* | 9/2011 | Takahashi | H01L 27/14636 257/432 |
| 2014/0151840 A1* | 6/2014 | Cheng | H01L 31/18 257/460 |
| 2015/0214267 A1* | 7/2015 | Chen | H01L 27/14636 257/432 |
| 2016/0260756 A1* | 9/2016 | Yamagishi | H01L 23/481 |
| 2017/0301715 A1* | 10/2017 | Cheng | H01L 27/14632 |
| 2020/0258923 A1 | 8/2020 | Ono et al. | |

FOREIGN PATENT DOCUMENTS

| | | |
|---|---|---|
| JP | 2011522411 A | 7/2011 |
| JP | 2015156512 A | 8/2015 |
| KR | 20140031779 A | 3/2014 |
| TW | 201201368 A1 | 1/2012 |
| TW | 201423970 A | 6/2014 |
| TW | 201523855 A | 6/2015 |
| TW | 201911550 A | 3/2019 |
| WO | WO2009145526 A3 | 12/2009 |

OTHER PUBLICATIONS

Taiwan Office Action, dated Apr. 19, 2021, for Taiwan Intellectual Property Office Appl. No. 109117231, 6 pages.

* cited by examiner

IMAGE SENSOR WITH PAD STRUCTURE

BACKGROUND

Semiconductor image sensors are used to sense incoming visible or non-visible radiation, such as visible light, infrared light, etc. Complementary metal-oxide-semiconductor (CMOS) image sensors (CIS) and charge-coupled device (CCD) sensors are used in various applications, such as digital still cameras, mobile phones, tablets, goggles, etc. These image sensors utilize an array of pixels that absorb (e.g., sense) the incoming radiation and convert it into electrical signals. An example of an image sensor is a back side illuminated (BSI) image sensor device, which detects radiation from a "back side" of a substrate.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
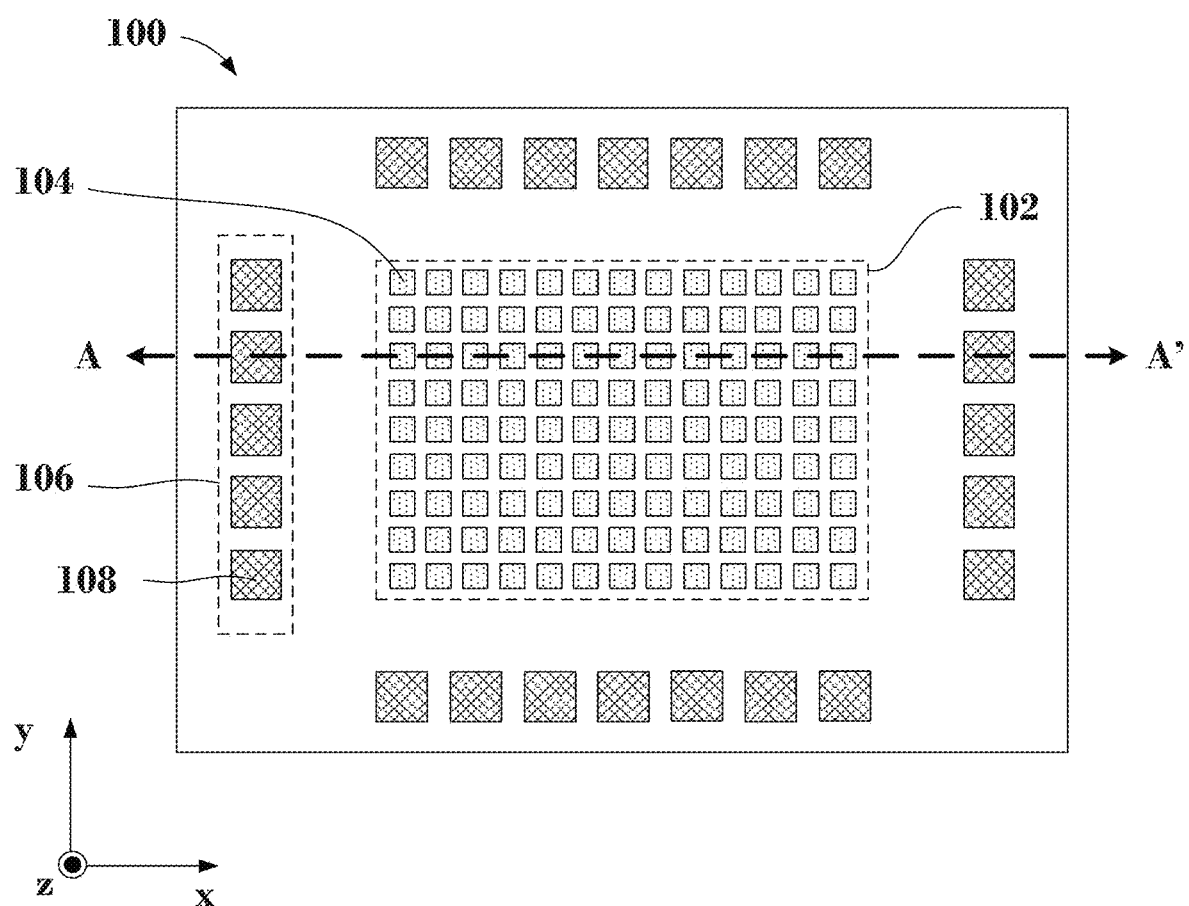
FIG. 1 is a plan-view of an exemplary image sensor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes and/or tolerances.

In some embodiments, the terms "about" and "substantially" can indicate a value of a given quantity that varies within 5% of the value (e.g., ±1%, ±2%, ±3%, ±4%, ±5% of the value).

A back side illuminated (BSI) image sensor device can include a semiconductor substrate (e.g., silicon substrate) with pixels or radiation-sensing regions formed therein. As disclosed herein, the terms "radiation-sensing regions" and "pixels" may be used interchangeably. A BSI image sensor device can include a pixel array arranged within the semiconductor substrate. The pixel array overlies a multilevel metallization layer (e.g., one or more interconnect structures) formed on a first surface of the semiconductor substrate. The first surface of the semiconductor substrate is referred to herein as the "front side" surface of the semiconductor substrate. The pixel array extends into the semiconductor substrate and is configured to receive radiation from a second surface of the semiconductor substrate opposite to the front surface of the semiconductor substrate. This second surface of the semiconductor substrate that receives the radiation (and is opposite to the front surface of the semiconductor substrate) is referred to herein as the "back" surface of the semiconductor substrate.

The pixels in the semiconductor substrate are electrically isolated with isolation structures, such as deep trench isolation (DTI) structures. Aligned to the aforementioned isolation structures and formed on the back surface of the semiconductor substrate) are respective grid structures that provide optical isolation between neighboring pixels. Adjacent grid structures collectively form cells. Further, the cells collectively form a composite grid structure configured to receive color filtering material. Based on the above description, the composite grid structure is formed on the back surface of the semiconductor substrate.

Color filtering material can be disposed between adjacent grid structures to form color filters. The color filtering material can be selected such that light with a desired wavelength passes through the filtering material, while light with other wavelengths is absorbed by the color filtering material. For example, a green light filtering material receiving unfiltered natural light would allow the green light portion (wavelengths between about 495 nm and about 570 nm) to pass through the filter, but would absorb all the other wavelengths. The color filters are aligned to respective pixels to provide filtered light to corresponding pixels.

The components of the BSI sensor device (e.g., pixels, transistors, capacitors, memory structures, other chips attached to the BSI sensor device, etc.) can be electrically coupled to external devices (e.g., an external circuitry) through wire connectors attached to pad structures formed on the back surface of the semiconductor substrate. To achieve this, the pad structures of a BSI sensor device physically extend from the back surface of the semiconductor substrate to the front surface of the semiconductor substrate and electrically connect to the multilevel metallization layer of the BSI sensor. Therefore, the multilevel metallization layer of the BSI sensor device, which provides electrical signal connection to the BSI sensor device, can be electrically coupled to an external device or circuit through the pad structures. The pad structures can be disposed at the periphery of the BSI sensor device around the pixels or the radiation-sensing regions. For example, such an arrangement is shown in FIG. 1, which shows a top view of a BSI sensor device 100 viewed from the back surface of the semiconductor substrate. In the view of FIG. 1, a pixel array 102 of pixels 104 is laterally surrounded by one or more pad arrays 106 that include pad structures 108.

Forming pad structures 108 in the semiconductor substrate requires etching the semiconductor substrate from the back surface until a conductive structure of the multilevel metallization layer proximal to the front surface of the semiconductor substrate is exposed. Formation of the pad structure is achieved by filling pad structure openings with a conductive material (e.g., a copper-aluminum alloy).

Various embodiments in accordance with this disclosure describe the formation of pad structures in an image sensor device (e.g., a BSI image sensor device) using a sacrificial isolation region and silicon oxide based layers (e.g., a silicon oxide based stack). The silicon oxide based stack does not include intervening nitride etch-stop layers, and therefore, simplifies the etching process during the formation of pad structure openings. In some embodiments, the etching process is simplified with respect to the etching chemistry and the number of etching operations. In some embodiments, the silicon oxide based layers include silicon oxide, undoped silicate glass (USG), phosphosilicate glass (PSG), borophosphosilicate glass (BPSG), polyethyloxazoline (PEOX), fluorine-doped silicate glass (FSG), a low-k dielectric material, or combinations thereof.

A pad structure formation with the use of a sacrificial isolation region and silicon oxide based layers will be discussed using the exemplary structures shown in FIGS. 1-13.

Figure 2:
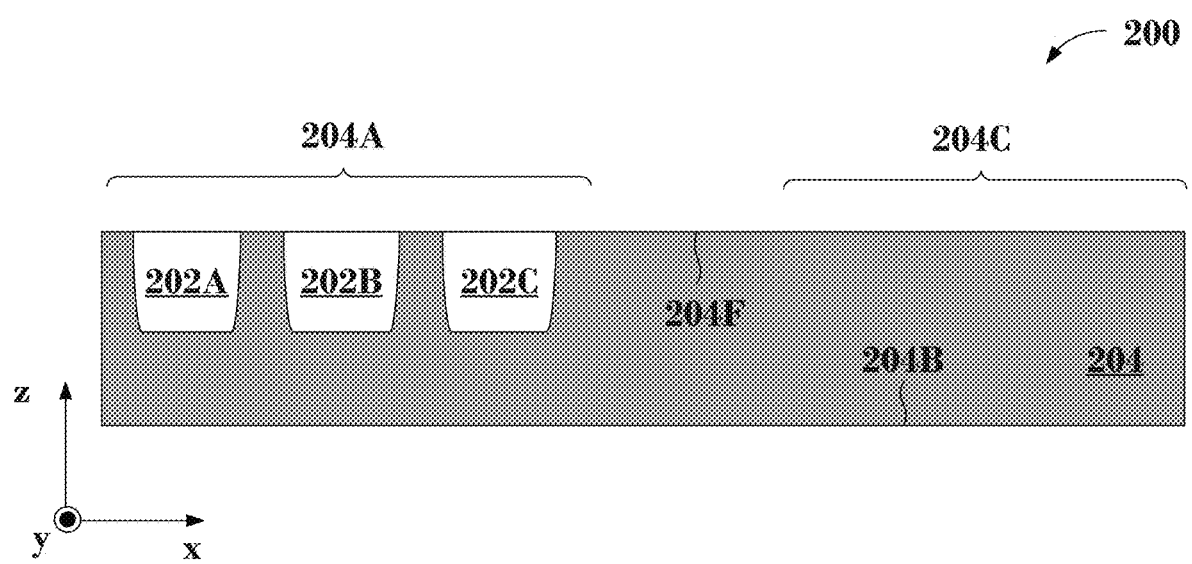
FIG. 2 is a cross-sectional view of a partially-fabricated image sensor device with a semiconductor layer and radiation sensing regions, in accordance with some embodiments.

FIG. 2 is a cross-sectional view of a partially-fabricated image sensor 200 (e.g., a partially fabricated BIS image sensor) with radiation-sensing regions or pixels 202A, 202B, and 202C formed in a semiconductor layer 204. In some embodiments, semiconductor layer 204 is a semiconductor substrate (e.g., a bulk semiconductor wafer, or a top layer of a semiconductor on insulator wafer (SOI)) with a thickness greater than about 6 µm (e.g., about 6.15 µm, about 6.30 µm, about 6.50 µm, and about 6.70 µm). By way of example and not limitation, semiconductor layer 204 can include a semiconductor material such as silicon, germanium, a compound semiconductor, an alloy semiconductor, any other suitable semiconductor material, and/or combinations thereof. Further, semiconductor layer 204 can be an epitaxial material strained for performance enhancement and/or a doped with n-type dopants, p-type dopants, or combinations thereof. In further embodiments, semiconductor layer 204 has combinations of p-type and n-type doped regions.

Radiation-sensing regions or pixels 202A, 202B, and 202C are formed in a portion of semiconductor layer 204 referred to as pixel region 204A. In some embodiments, pixel region 204A is a center region of semiconductor layer 204. For example, pixel region 204A may correspond to a region where pixel array 102 is formed in BSI sensor device 100 shown in FIG. 1.

Radiation-sensing regions or pixels 202A, 202B, and 202C are configured to sense electromagnetic radiation, such as incident visible light. By way of example and not limitation, each of pixels 202A, 202B, and 202C includes a photodiode structure, such as a pinned layer photodiode, a photogate, a reset transistor, a source follower transistor, a transfer transistor, any other suitable structure, and/or combinations thereof. Further, pixels 202A, 202B, and 202C may also be referred to as "radiation-detection devices" or "light-sensors." For simplicity purposes, three pixels 202A, 202B, and 202C are illustrated in FIG. 2; however any number of pixels may be implemented in semiconductor layer 204. In some embodiments, pixels 202A, 202B, and 202C are formed by doping semiconductor layer 204 from front surface 204F. By way of example, and not limitation, the doping process can include doping semiconductor layer 204 with a p-type dopant, such as boron, or an n-type dopant, such as phosphorous or arsenic. In some embodiments, pixels 202A, 202B, and 202C are formed by a dopant diffusion process.

In some embodiments, pad structures are formed in a pad region 204C located at the periphery of semiconductor layer 204. By way of example and not limitation, pad region 204C corresponds to a region that pad arrays 106 are formed in BSI sensor device 100 shown in FIG. 1. Referring to FIG. 2, according to some embodiments, an isolation region used to facilitate the pad formation is formed in pad region 204C of semiconductor layer 204. In some embodiments, concurrently with the isolation region in pad region 204C, isolation regions can be formed in pixel region 204A to isolate pixels 202A, 202B, and 202C. By way of example and not limitation, the isolation regions can be formed in a portion of front surface 204F.

Figure 3:
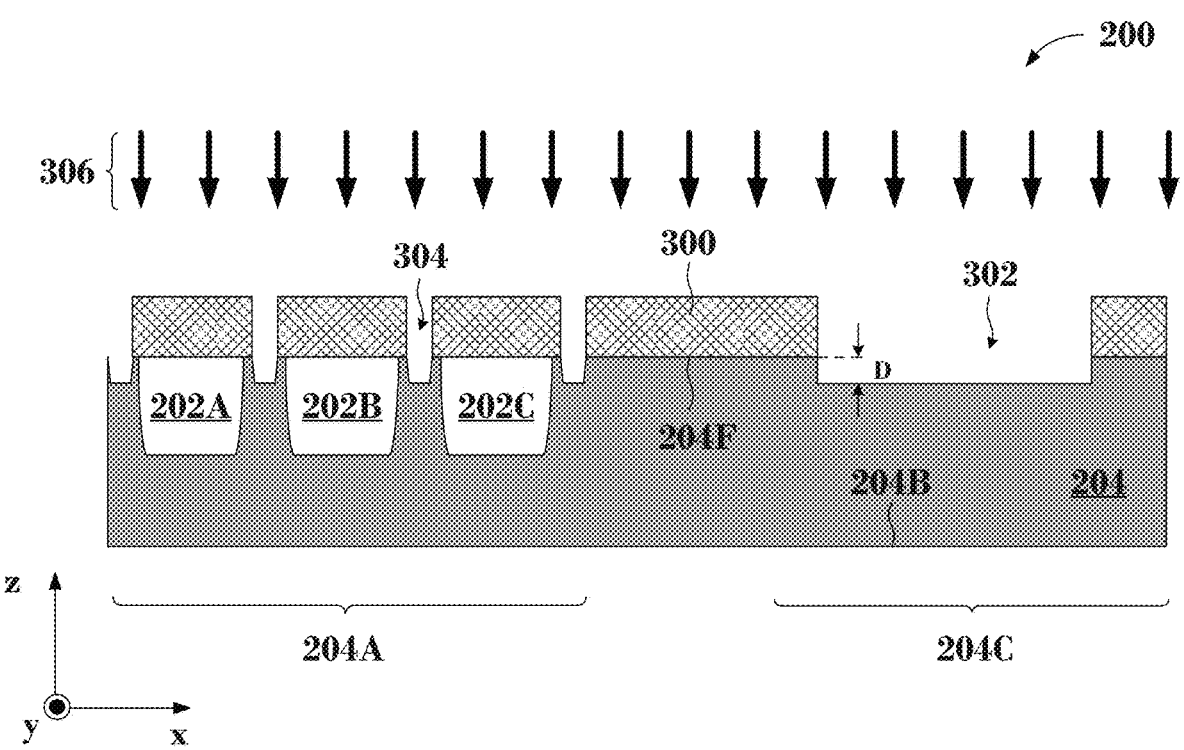
FIGS. 3 and 4 are cross-sectional views of a partially-fabricated image sensor device during the fabrication of isolation regions, in accordance with some embodiments.

Referring to FIG. 3, a photoresist layer 300 is disposed and patterned on front surface 204F of semiconductor layer 204 so that a portion of front surface 204F in pad region 204C is exposed as a result of the patterning operation. Subsequently, using the pattern photoresist layer 300 as an etch mask, an etching process forms opening 302 and openings 304 in the front surface 204F of semiconductor layer 204. By way of example and not limitation, the etching process uses a dry etchant 306, such as a halogen-based gas. For example, if semiconductor layer 204 includes silicon, dry etchant 306 can include a hydrogen bromide (HBr) gas. According to some embodiments, isolation regions are formed in openings 302 and 304. A depth D of opening 302 measured from front surface 204F defines a thickness of the isolation region. By way of example and not limitation, openings 304 may have a depth equal to or less than depth D due to etch loading effects. In some embodiments, depth I) of opening 302 is between about 100 nm and about 1000 nm (e.g., between about 100 nm and 200 nm, between about 150 nm and about 300 nm, between about 250 nm and about 500 nm, between about 350 and about 700 nm, between about 450 nm and about 900 nm, and between about 600 nm and about 1000 nm). After the formation of opening 302 and openings 304, patterned photoresist layer 300 can be removed with a wet etching process.

Figure 4:
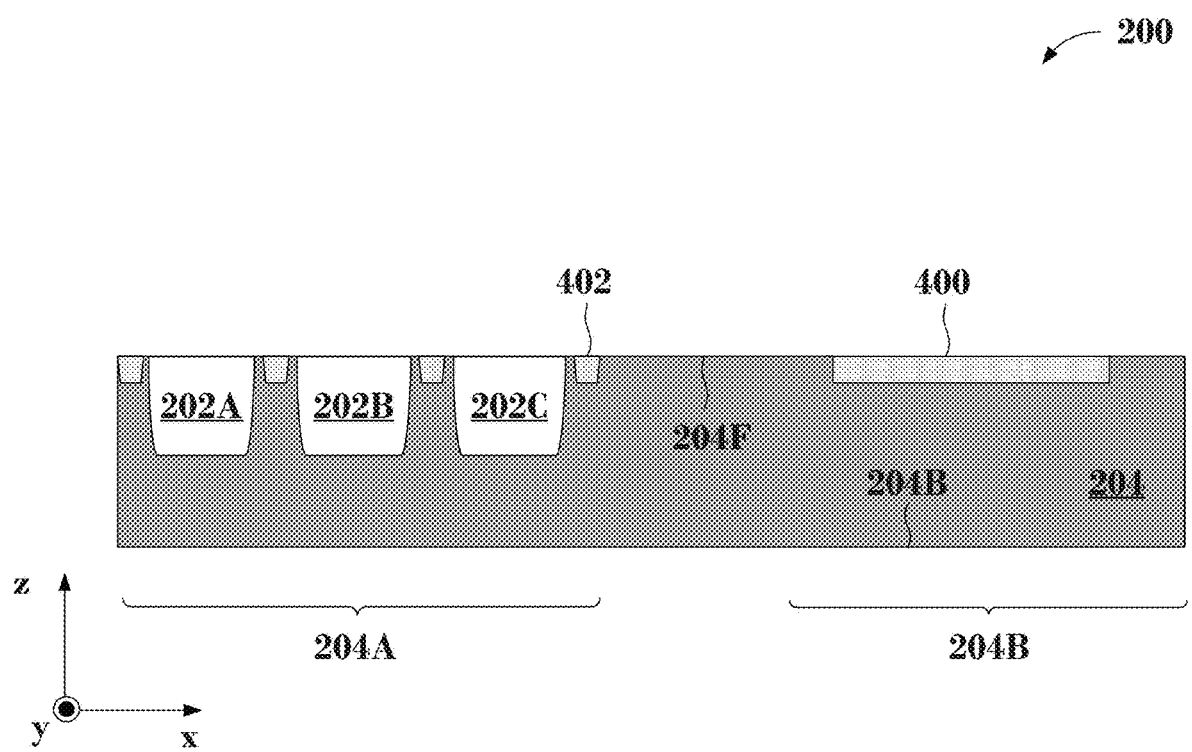

In some embodiments, the isolation regions are subsequently formed by depositing one or more layers including, but not limited to, silicon oxide, USG, PSG, BPSG, PEOX, FSG, a low-k dielectric material (e.g., with a k value less than about 3.9), or combinations thereof. The one or more layers of the isolation region can be "blanket deposited" (e.g., deposited on the entire front surface 204F of semiconductor layer 204) to fill openings 302 and 304. Consequently, a planarization process (e.g., a chemical mechanical planarization (CMP) process) or an etch back process (e.g., a dry etching process) can remove deposited material outside the openings. By way of example and not limitation, FIG. 4 shows partially-fabricated image sensor 200 after the formation of isolation region 400 in pad region 204C and isolation regions 402 in pixel region 204A. According to some embodiments, a top surface of isolation regions 400 and 402 are substantially coplanar with front surface 204F of semiconductor layer 204, as shown in FIG. 4. In some embodiments, the thickness or height of isolation region 400 ranges between about 100 nm and about 1000 nm (e.g., between about 100 nm and 200 nm, between about 150 nm and about 300 nm, between about 250 nm and about 500 nm, between about 350 and about 700 nm, between about 450 nm and about 900 nm, and between about 600 nm and about 1000 nm). In some embodiments, the thickness or height of isolation regions 402 is equal to or less than that about the thickness or height of isolation region 400.

Figure 5:
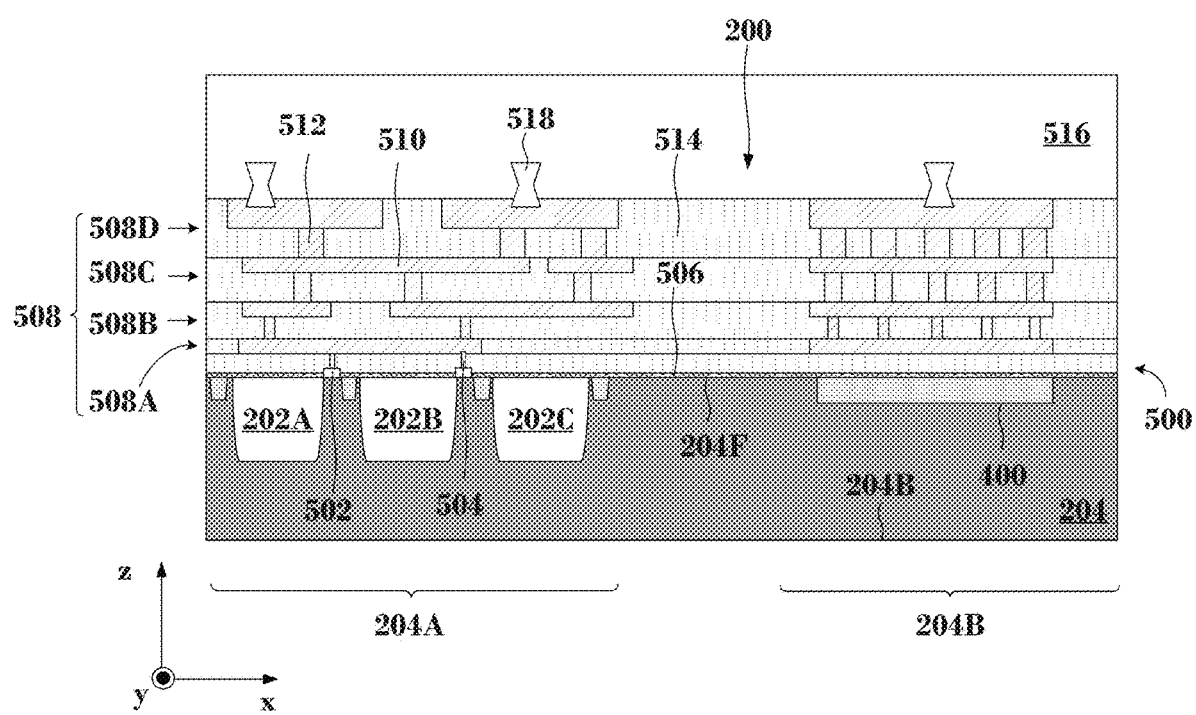
FIG. 5 is a cross-sectional view of a partially-fabricated image sensor device with metallization layers and an application specific integrated circuit formed thereon, in accordance with some embodiments.

In referring to FIG. 5, a device layer 500 with semiconductor devices 502 (e.g., field effect transistors) can be formed according to a chip layout on front surface 204F of semiconductor layer 204. Device layer 500 may also include additional elements or structures, such as doped regions, dummy regions, epitaxial layers, capacitor structures, resistors, etc. These additional elements or structures of device layer 500 are not shown in FIG. 5 for simplicity. Device layer 500 further includes vertical conductive structures 504 (e.g., metal contacts) that electrically connect semiconductor devices 502 and other elements of device layer 500 to upper metallization layers 508. In some embodiments, device layer 500 further includes a nitride layer 506 that is used as an etch stop layer (ESL) in a subsequent etching operation during the formation of the pad structure. By way of example and not limitation, conductive structures 504 can form a middle of the line (MOL) wiring network.

In some embodiments, upper metallization layers 508 include one or more metallization layers, such as metallization layers 508A through 508D. In some embodiments, metallization layer 508A is a first metallization layer and metallization layer 508D is a top metallization layer. In some embodiments, metallization layers 508 form a back end of the line (BEOL) wiring network. Each layer of metallization layers 508 (e.g., metallization layers 508A-508D) can include lateral conductive structures 510 (e.g., lines) and vertical conductive structures 512 (e.g., vertical interconnect access (vias)), where vertical conductive structures 512 wire adjacent metallization layers along the z-axis.

In some embodiments, device layer 500 and upper metallization layers 508 further include a dielectric layer 514 that electrically isolates the elements and structures therein. In some embodiments, dielectric layer 514 is an interlayer dielectric (ILD) or inter-metal dielectric (IMD) layer that includes silicon oxide, USG, BPSG, a low-k dielectric (e.g., with a dielectric constant lower than 3.9), or a stack of dielectrics—such as a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; or (iv) a low-k dielectric (e.g., carbon doped silicon oxide) with silicon oxide. In some embodiments, dielectric layer 514 in device layer 500 can be different from dielectric layer 514 in metallization layers 508. Further, nitride layer 506 can be interposed between dielectric layer 514 of device layer 500 and front surface 204F of semiconductor layer 204. In some embodiments, nitride layer 506 is formed around semiconductor devices 502, but not between semiconductor devices 502 and semiconductor layer 204.

In further embodiments, device layer 500 and upper metallization layers 508 can be formed on a separate semiconductor layer (e.g., different from semiconductor layer 204) and be subsequently attached to front surface 204F of semiconductor layer 204.

In some embodiments, an application specific integrated circuit (ASIC) 516 can be attached to top metallization layer 508D of partially-fabricated image sensor 200 to form a three-dimensional (3D) stack. By way of example and not limitation, bonding structures 518 can be used to electrically and mechanically bond ASIC 516 to top metallization layer 508D of partially-fabricated image sensor 200. By way of example and not limitation, ASIC 516 can add functionality to partially-fabricated image sensor 200 or may control functions of partially-fabricated image sensor 200. In some embodiments, ASIC 516 includes metallization layers, semiconductor devices, memory devices, or can be a stack of chips such as memory chips, central processing unit (CPU) chips, other functional chips (e.g., RF chips), or combinations thereof.

Figure 6:
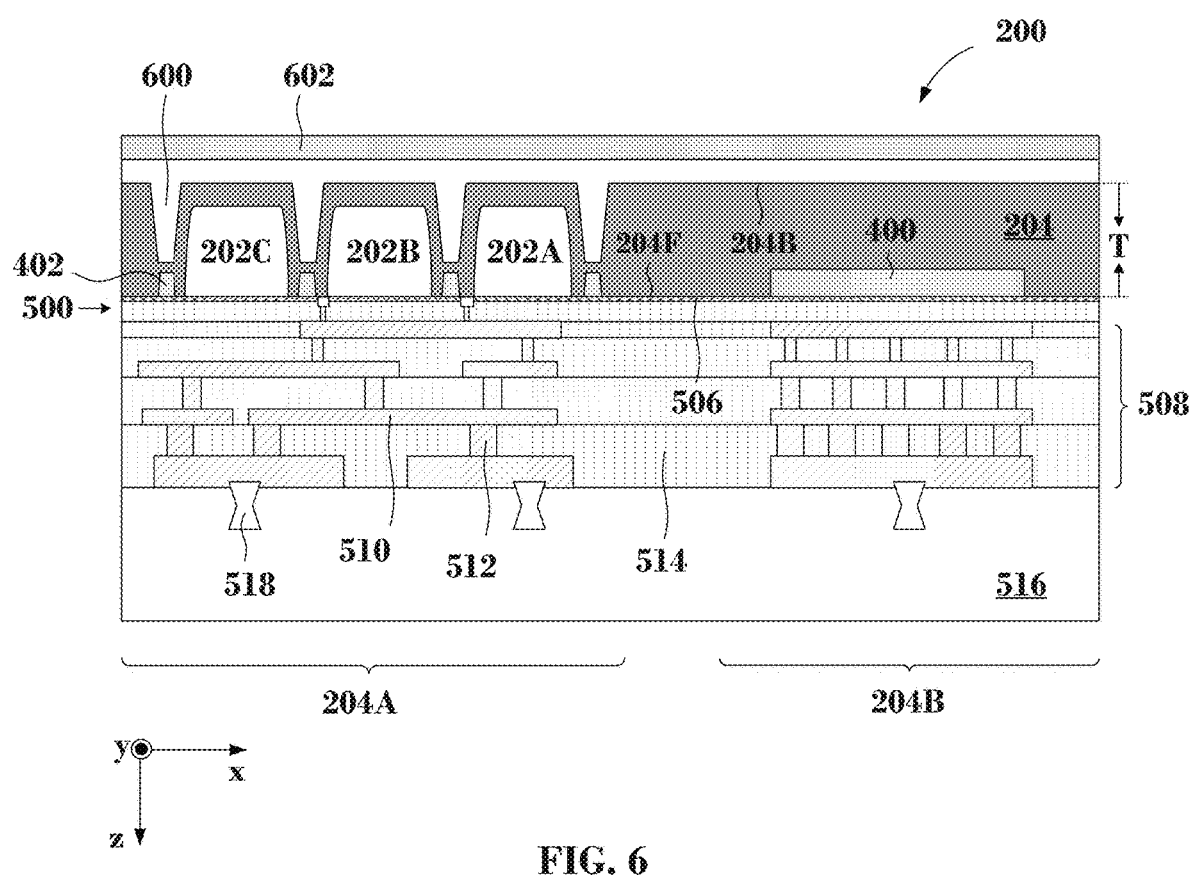
FIG. 6 is a cross-sectional view of a partially-fabricated image sensor device after the formation of isolation regions between radiation sensing regions and the deposition of a passivation layer, in accordance with some embodiments.

In some embodiments, the fabrication of partially-fabricated image sensor 200 may continue with the formation of additional structures in semiconductor layer 204 from back surface 204B. For this reason, partially-fabricated image sensor 200 can be rotated 180 around the x-axis, as shown in FIG. 6. In some embodiments, isolation regions 600, aligned to isolation regions 402, are formed to further isolate radiation sensing regions or pixels 202A, 202B, and 202C in pixel region 204A of semiconductor layer 204. By way of example and not limitation, isolation regions 600 may include one or more dielectric materials and form deep trench isolation (DTI) structures. By way of example and not limitation, isolation regions 600 can be formed by etching semiconductor layer 204 to form respective trenches between radiation sensing regions or pixels 202A, 2028, and 202C. The trenches are subsequently filled with one or more dielectric materials. In some embodiments, the one or more dielectric layers used to form isolation regions 600 in pixel region 204A form a layer on pad region 204C of semiconductor layer 204, as shown in FIG. 6. In further embodiments, prior to the formation of isolation regions 600 on back surface 204B, semiconductor layer 204 is thinned to a thickness T as shown in FIG. 6. By way of example and not limitation, thickness T can range from about 2 μm to about 6 μm (e.g, about 3 μm). The thinning of semiconductor layer 204 may, for example, be performed by a planarization process (e.g., a CMP process), an etch-back process (e.g., a dry etching process), some other thinning process (e.g., grinding), or a combination thereof. Thinning of semiconductor layer 204 facilitates the formation of isolation regions 600 and the subsequent formation of the pad structure. For example, a thinned-down semiconductor layer 204 (e.g., about 3 μm) is easier to etch and form isolation regions 600 and the pad structure compared to, for example, a thicker semiconductor layer 204 (e.g., equal to or thicker than about 6 μm).

Figure 7:
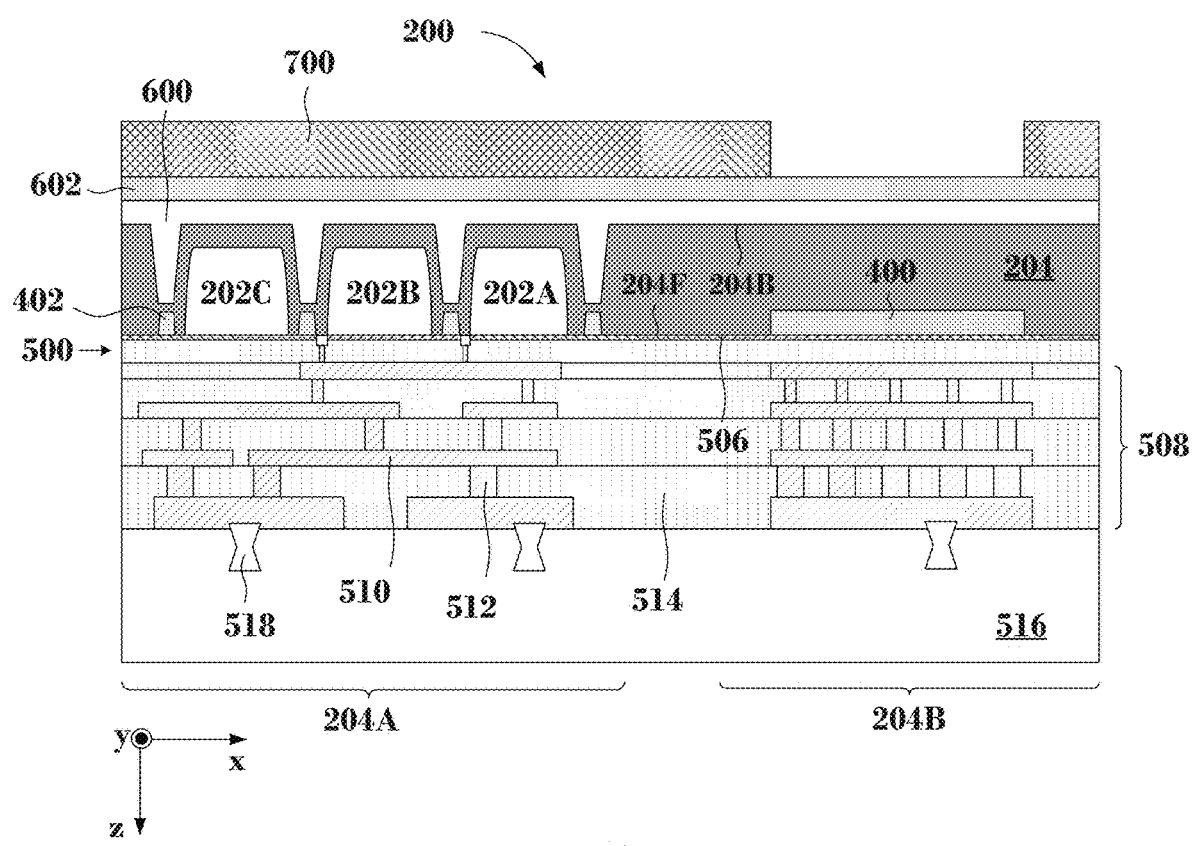
FIGS. 7 through 10 are cross-sectional views of a partially-fabricated image sensor device during the fabrication of a pad structure opening, in accordance with some embodiments.

Subsequently, a passivation layer 602 can be deposited on isolation regions 600 as shown in FIG. 6. Passivation layer 602 can be a dielectric layer, such as silicon oxide, silicon nitride, or combinations thereof. In some embodiments, passivation layer 602 is a protective layer or a hard mask (HM) layer grown or deposited on pixel region 204A and pad region 204C, as shown in FIG. 6. Referring to FIG. 7, a photoresist layer 700 can be disposed on passivation layer 602 and subsequently patterned in pad region 204C to expose a portion of passivation layer 602 aligned with isolation region 400. In some embodiments, and referring to FIG. 8, a dry etching process (e.g. reactive ion etching (RIE) process), which may use one or more etching operations, forms opening 800 to expose dielectric layer 514 of device layer 500.

Figure 8:
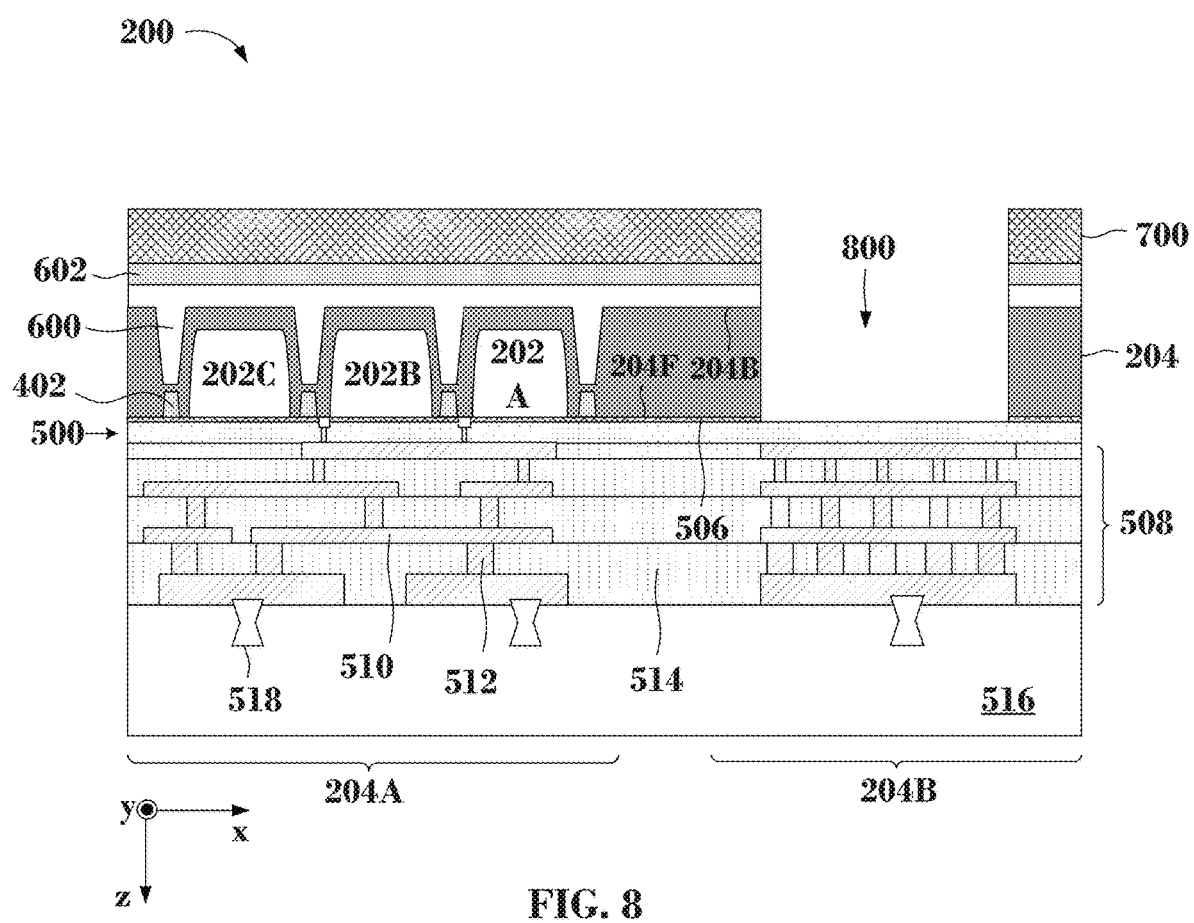

In some embodiments, the dry etching process may use one or more different etching gases to etch passivation layer 602, the layer of isolation regions 600, semiconductor layer 204, isolation region 400, and nitride layer 506. By way of example and not limitation, the material of semiconductor layer 204 (e.g., silicon) can be etched with a gas mixture of chlorine ($Cl_2$) and HBr. In some embodiments, the drying etching process endpoints on isolation region 400. In some embodiments, the dry etching process etches between about 200 Å and 300 Å of material from isolation region 400 before it is endpointed. Subsequently, the dry etching process—e.g., using tetrafluoromethane ($CF_4$) gas—removes isolation region 400 and endpoints on nitride layer 506. An over-etch operation—e.g., using octafluorocyclobutane ($C_4F_8$) gas—removes nitride layer 506 to expose dielectric layer 514 of device layer 500, as shown in FIG. 8. In other words, the etching process is terminated when dielectric layer 514 of device layer 500 is exposed through opening 800.

Figure 9:
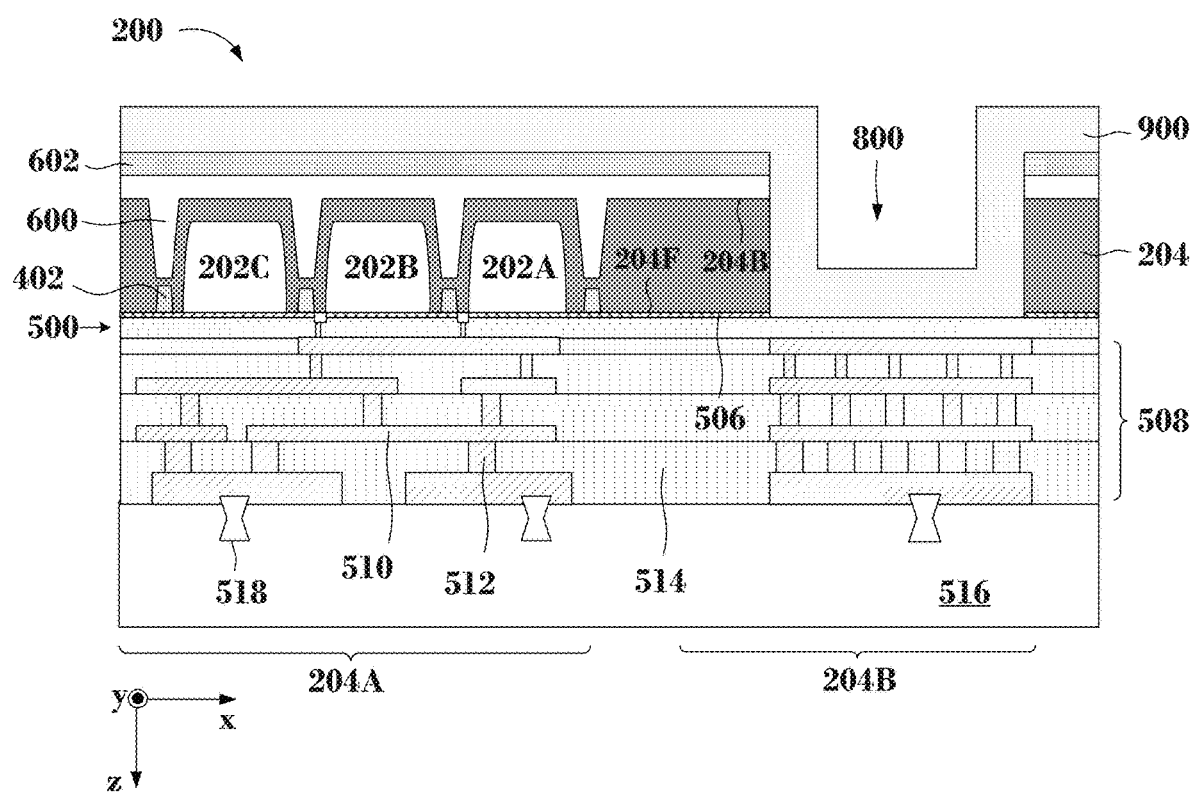

After the formation of opening 800, patterned photoresist layer 700 can be removed with a wet etching process, and an oxide layer 900 can be conformally deposited on the exposed surfaces of opening 800 (e.g., including dielectric layer 514 of device layer 500) and on passivation layer 602, as shown in FIG. 9. By way of example and not limitation, oxide layer 900 is a silicon oxide dielectric, such as a PEOX, with a thickness range between about 100 nm and about 700 nm (e.g., about 400 nm). In further embodiments, oxide layer 900 includes materials, such as USG, PSG, BPSG, FSG, a low-k dielectric material, or combinations thereof. In some embodiments, oxide layer 900 is a buffer oxide or a buffer oxide stack that facilitates the etching process for the pad structure opening formation.

Figure 10:
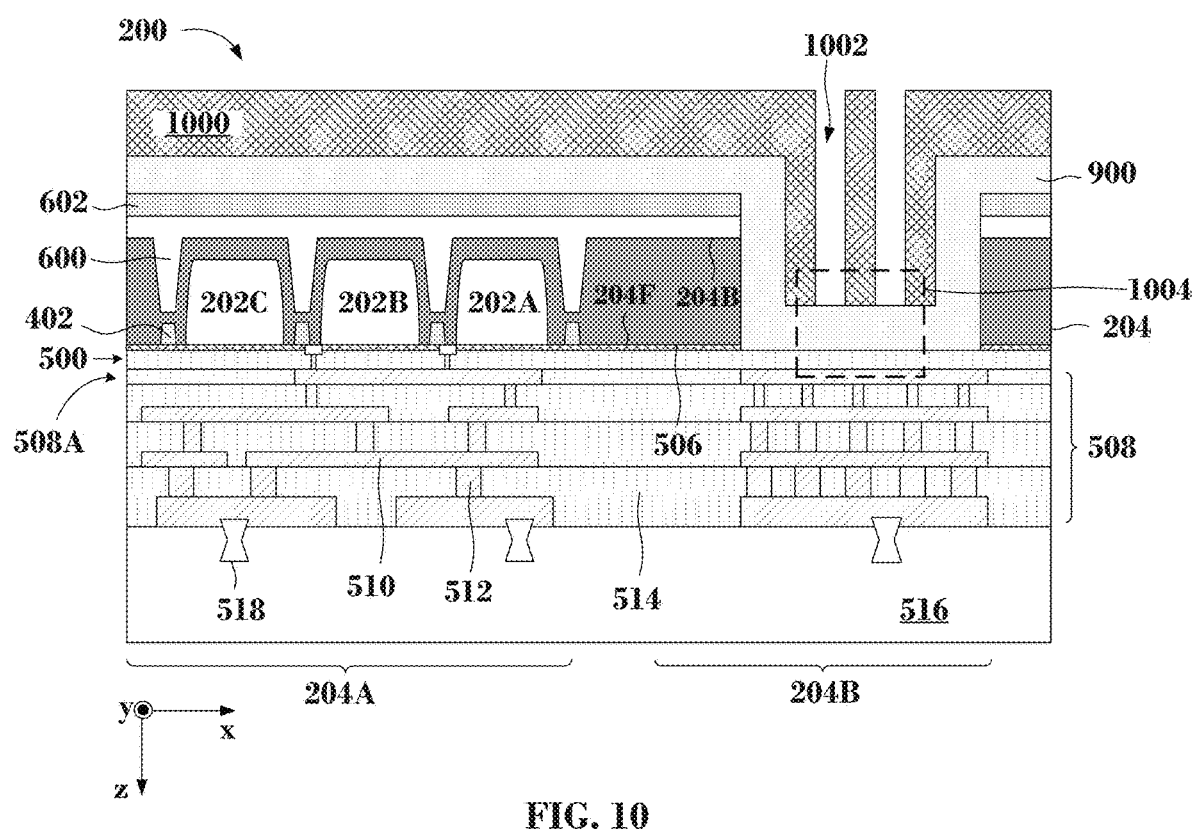

Referring to FIG. 10, a photoresist layer 1000 is subsequently disposed (e.g., spin coated) and patterned on partially-fabricated image sensor 200 to form openings 1002 exposing portions of oxide layer 900 within opening 800. In some embodiments, patterned photoresist layer 1000 is used as an etch mask during a dry etching process to remove exposed portions of oxide layer 900 and dielectric layer 514 of device layer 500. In some embodiments, the dry etching process is a RIE process that includes $CF_4$ gas. Since oxide layer 900 and dielectric layer 514 of device layer 500 are silicon oxide based materials (e.g., PEOX, USG, PSG, BPSG, silicon oxide, etc.), a simplified etching process (e.g., an etching process with a single etching chemistry) can be used to expose the nearest lateral conductive structure 510 of metallization layer 508A.

Figure 11:
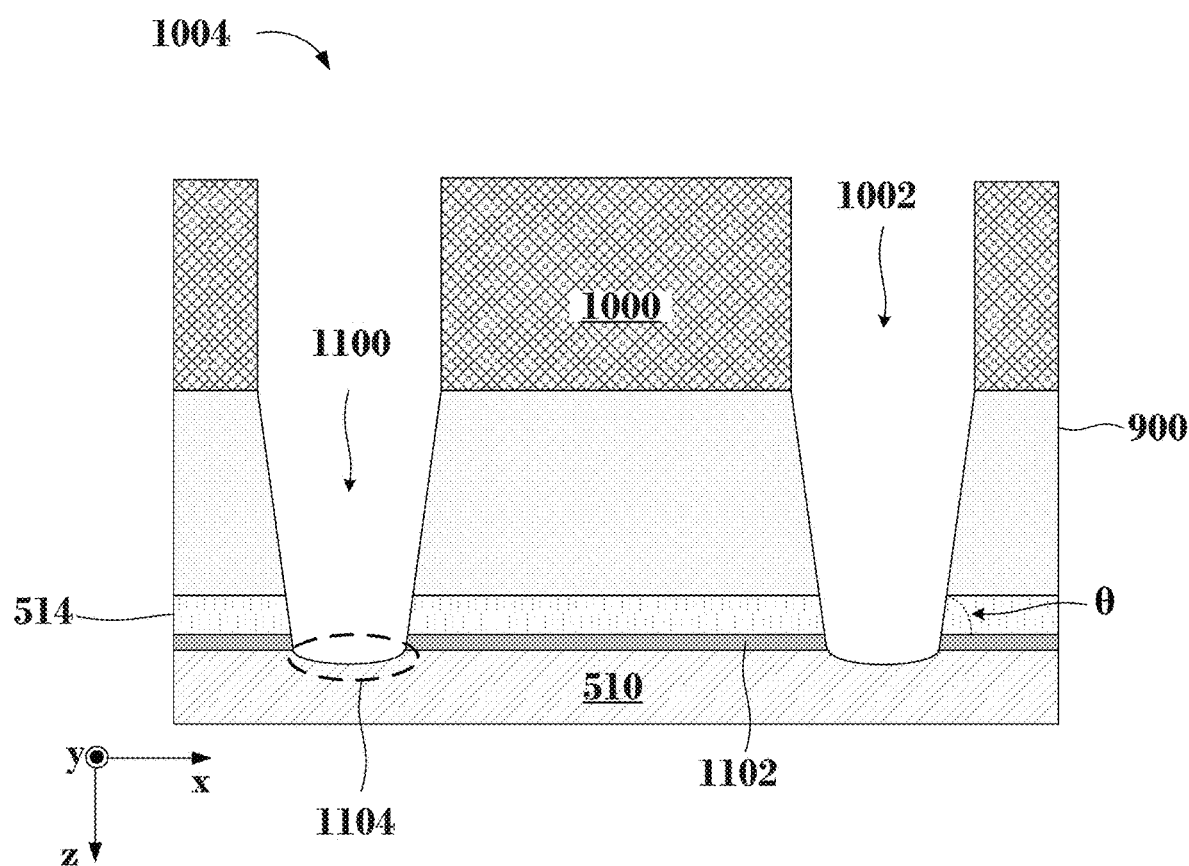
FIG. 11 is a magnified cross-sectional view of an isolation region in a partially-fabricated image sensor device after the formation of pad structure openings, in accordance with some embodiments.

According to some embodiments, FIG. 11 is a magnified view of area 1004 of partially-fabricated image sensor 200, shown in FIG. 10, after the above-mentioned etching process. In FIG. 11, resulting openings 1100 in oxide layer 900 and dielectric layer 514 expose portions of lateral conductive structure 510. FIG. 11 is a more detail view of area 1004 and it includes additional layers such as liner layer 1102 of lateral conductive structure 510, which is not shown in FIG. 10 for simplicity. By way of example and not limitation, liner layer 1102 can include tantalum nitride (TaN), which functions as a diffusion barrier layer for the conductive material (e.g., copper) in conductive structure 510. In further embodiments, liner layer 1102 functions as an ESL for the dry etching process, and consequently, a second drying etching operation (e.g., an over-etch process) may be necessary to "punch-through" liner layer 1102 and expose lateral conductive structure 510, as shown in FIG. 11. By way of example and not limitation, the over-etch process may use $C_4F_8$ gas. In some embodiments, liner layer 1102 can range from about 25 nm to about 60 nm (e.g., between about 25 nm and about 40 nm, between about 30 nm and about 50 nm, between about 35 nm and about 60 nm). In some embodiments, the over-etch process may superficially etch conductive structure 510 to form a shallow divot (e.g., between about 1 urn to about 5 nm) as shown in FIG. 11. In some embodiments, this superficial etch is intentional because it increases contact area 1104 of conductive structure 510 and reduces the contact resistance of the pad structure.

By way of example and not limitation, openings 1100 can have an aspect ratio between about 1.2 and about 2 (e.g., about 1.2, about 1.5, about 1.8, and about 2), and a sidewall angle θ between about 75° and about 85° (e.g., about 75°, about 78°, about 80°, about 82°, about 83°, and about 85°).

According to some embodiments, the use of an oxide-based stack (e.g., oxide layer 900 and dielectric layer 514)—as opposed to a combination of oxide and etch-stop nitride layers simplifies the etching process in terms of etching chemistry and required number of etching operations, and provides openings 1100 with substantially more vertical sidewalls. For example, a sidewall angle of an opening in a stack that includes a combination of oxide and etch-stop nitride layers can be as wide as 45°. Further, an oxide-based stack, due to its homogeneity, reduces the mechanical stress induced to the pad structure and mitigates stress related failures. For example, thermal stress may develop in stacks with nitride and oxide layers due to differences in the thermal expansion coefficients between the nitride and oxide layers. The thermal stress can in turn induce mechanical stress in the pad structure.

Figure 12:
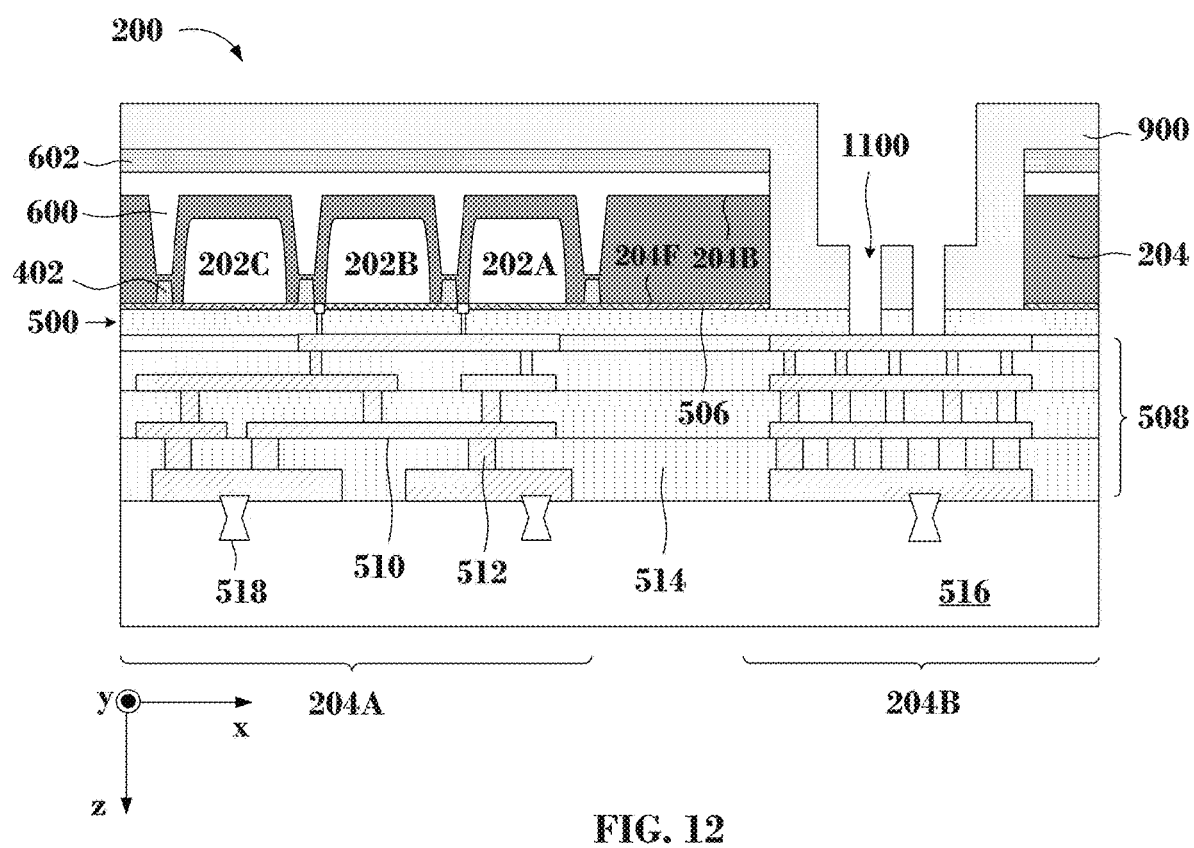
FIG. 12 is a cross-sectional view of a partially-fabricated image sensor device after the formation of pad structure openings, in accordance with some embodiments.
Figure 13:
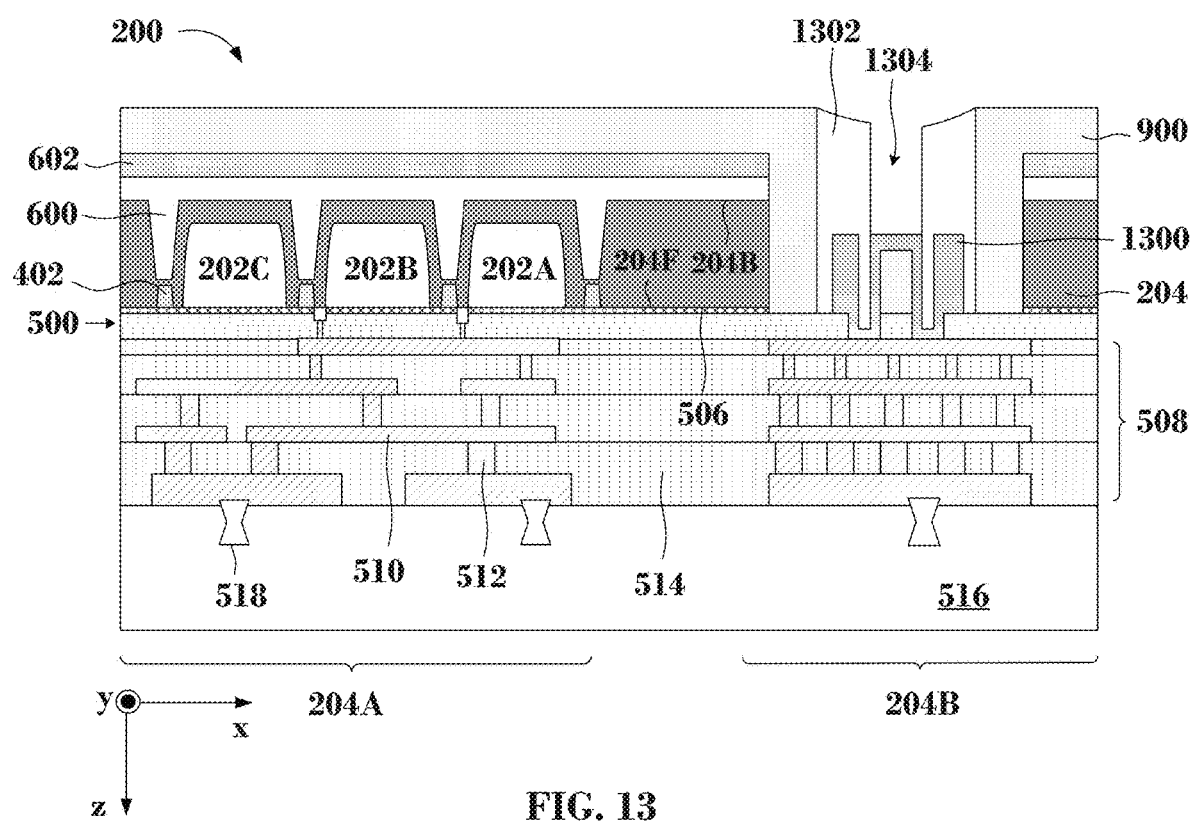
FIG. 13 is a cross-sectional view of a partially-fabricated image sensor device after the formation of a pad structure, in accordance with some embodiments.

According to some embodiments, FIG. 12 is partially-fabricated image sensor 200 after the formation of openings 1100 and the removal of patterned photoresist layer 1000 shown in FIGS. 10 and 11. In referring to FIGS. 12 and 13, a metal layer can be deposited and subsequently patterned in opening 1100 to form pad structure 1300. For example, patterning of the metal layer can be accomplished with photolithography and etching operations. In some embodiments, pad structure 1300 includes a metal alloy—for example, aluminum-copper (AlCu). However, this is not limiting and other suitable metals or metal alloys may be used. In further embodiments, a dielectric layer 1302 (e.g., a USG layer or another oxide) is deposited on pad structure 1300. The top surface dielectric layer 1302 may be dished from a CMP process that polishes and removes deposited amounts of dielectric layer 1302 on oxide layer 900. In some embodiments, dielectric layer 1302 is patterned so that an opening 1304 is formed to expose a portion of pad structure 1300. By way of example and not limitation, a wire connector, not shown in FIG. 13, can be formed in opening 1304. According to some embodiments, a wire connector—through pad structure 1300—electrically connects metallization layers 508 to one or more external components.

Figure 14A:
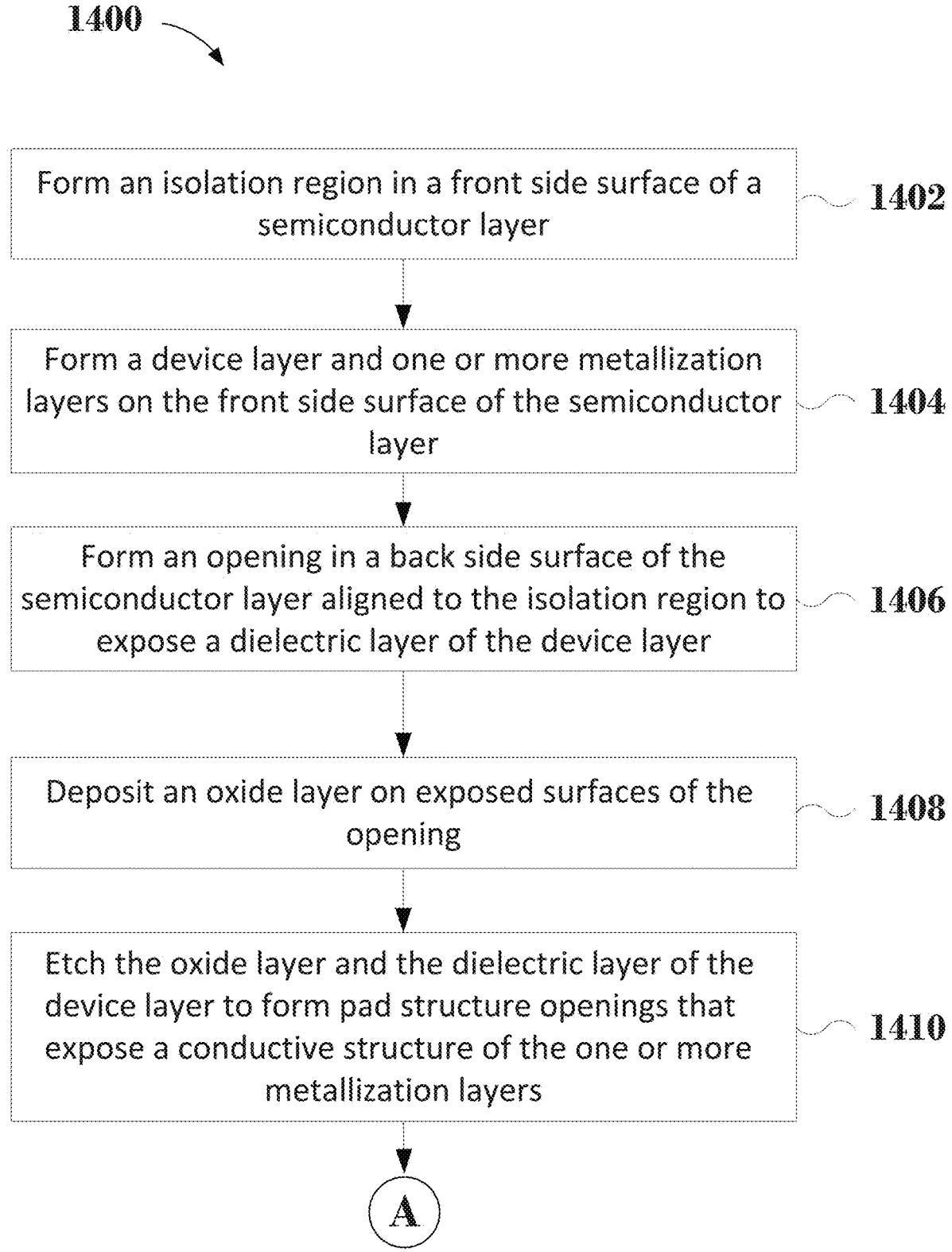
FIGS. 14A and 14B are a flow diagram of an exemplary method for forming an image sensor device with a pad structure formed in an oxide stack, in accordance with some embodiments.
Figure 14B:
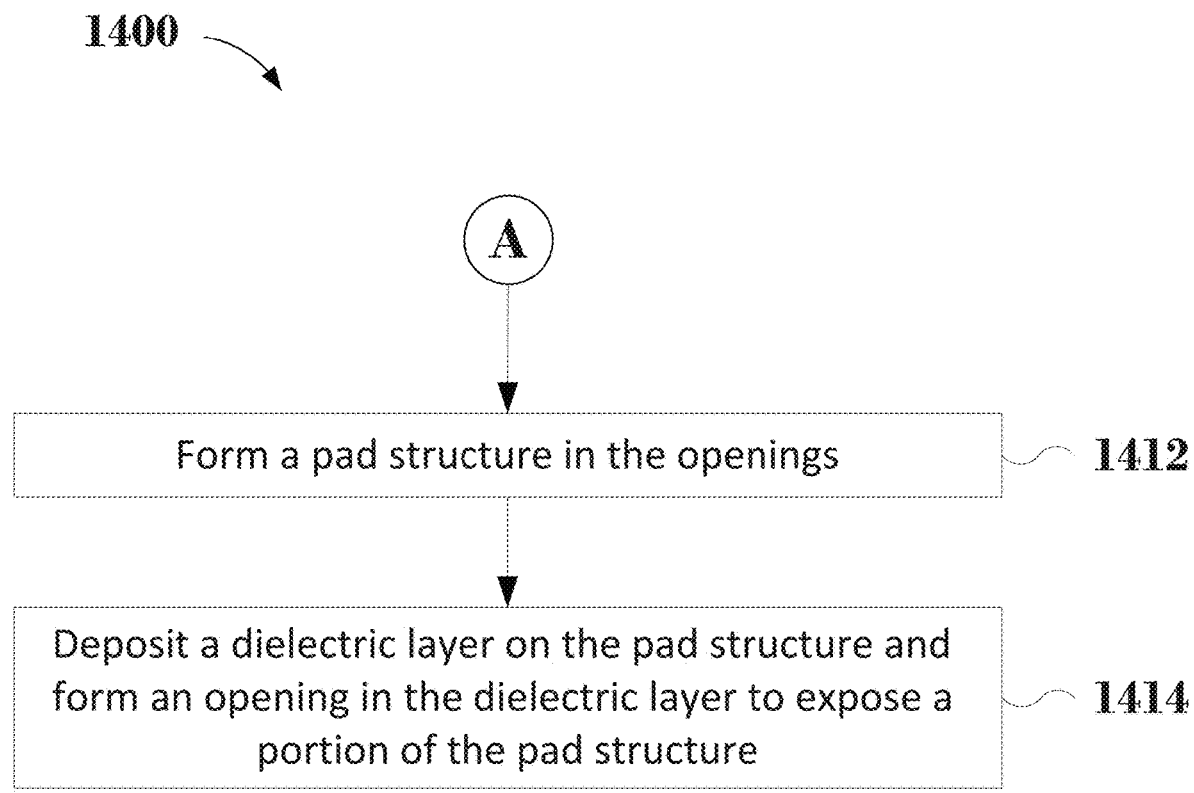

FIGS. 14A and 14B describe method 1400 for the formation of a pad structure in an image sensor device using a sacrificial isolation region and an oxide-based stack, according to some embodiments. The oxide-based stack described in method 1400 does not include nitride etch-stop layers—for example, silicon nitride layers. Other fabrication operations may be performed between the various operations of method 1400 and may be omitted merely for clarity. Embodiments of the present disclosure are not limited to method 1400. Method 1400 will be described using the exemplary structures shown in FIGS. 2-13.

In referring to FIG. 14A, method 1400 begins with operation 1402 and the formation of an isolation region on a front surface of a semiconductor layer. By way of example and not limitation, the isolation region of method 1400 is similar to isolation region 400 formed in front surface 204F of semiconductor layer 204 shown in FIG. 4 and described in FIGS. 2 and 3. In some embodiments, the thickness of isolation region 400 ranges between about 100 nm and about 1000 nm (e.g., between about 100 nm and 200 nm, between about 150 nm and about 300 nm, between about 250 nm and about 500 nm, between about 350 and about 700 nm, between about 450 nm and about 900 nm, and between about 600 nm and about 1000 nm) and includes one or more oxide layers like silicon oxide, USG, PSG, BPSG, PEOX, FSG, a low-k dielectric material (e.g., carbon doped silicon oxide), or combinations thereof.

In referring to FIG. 14A, method 1400 continues with operation 1404 and the formation of a device layer and one or more metallization layers on the front surface of the semiconductor layer. By way of example and not limitation, the device layer and the one or more metallization layers of operation 1404 are similar to device layer 500 and metallization layers 508A-508D shown in FIG. 5. In some embodiments, the device layer (e.g., like device layer 500) can include a nitride layer 506, which functions as an etch stop layer in a subsequent etching operation. In some embodiments, an ASIC (e.g., like ASIC 516 shown in FIG. 5) can be mechanically and electrically bonded to a top metallization layer (e.g., like top metallization layer 508D) of the one or more metallization layers to form a 3D stack, as shown in FIG. 5. By way of example and not limitation, the ASIC can add functionality to the image sensor device, may control functions of the image sensor device, or both. Consequently, the ASIC may include metallization layers, semiconductor devices, memory devices, or can be a stack of chips such as memory chips, CPU chips, other functional chips (e.g., RF chips), or combinations thereof.

In referring to FIG. 14A, method 1400 continues with operation 1406 and the formation of an opening in a back surface of the semiconductor layer (e.g., opposite to the front surface of the semiconductor layer) aligned to the isolation region to expose a dielectric layer of the device layer. According to some embodiments, an example of operation 1406 is shown in FIG. 8, where photolithography and etching operations are used to form opening 800 in back surface 204B of semiconductor layer 204 to expose dielectric layer 514 of device layer 500. By way of example and not limitation, the material of semiconductor layer 204 (e.g., silicon) can be etched with a gas mixture of $Cl_2$ and HBr. In some embodiments, the drying etching process endpoints on isolation region 400 and etches between about 200 Å and 300 Å of material from isolation region 400 before it is endpointed. Subsequently, the dry etching process—e.g., using tetrafluoromethane ($CF_4$) gas—removes isolation region 400 and endpoints on nitride layer 506. An over-etch operation—e.g., using octafluorocyclobutane ($C_4F_8$) gas—removes nitride layer 506 to expose dielectric layer 514 of device layer 500, as shown in FIG. 8.

In referring to FIG. 14A, method 1400 continues with operation 1408 and the deposition of an oxide layer on exposed surfaces of the opening. According to some embodiments, an example of operation 1408 is shown in FIG. 9, where oxide layer 900 is deposited on back surface 204B and the exposed surfaces of opening 800—including exposed potions of dielectric layer 514 of device layer 500. In some embodiments, the oxide layer of operation 1408, like oxide layer 900 of FIG. 9, is a silicon oxide based dielectric, such as a PEOX, USG, PSG, BPSG, FSG, a low-k dielectric material, or combinations thereof, with a thickness range between about 100 nm and about 700 nm (e.g., between about 100 nm and about 250 nm between about 150 nm and about 300 nm, between about 270 nm and about 400 nm, between about 350 and about 500 nm, between about 420 nm and about 600 nm, between about 400 and about 680 nm, between about 450 nm and about 700 nm). In some embodiments, the oxide layer of operation 1408 is a buffer oxide or a buffer oxide stack that facilitates the etching process for the pad structure openings described in operation 1410 of method 1400.

In referring to FIG. 14A, method 1400 continues with operation 1410 where the oxide layer and the dielectric layer of the device layer are etched to form pad structure openings that expose a conductive structure of a metallization layer of the one or more metallization layers, By way of example and not limitation, pad structure openings (e.g., according to operation 1410) are openings 1100 shown in FIGS. 11 and 12. By way of example and not limitation, openings 1100 are formed with a dry etching process that uses $CF_4$ gas. Since oxide layer 900 and dielectric layer 514 of device layer 500 are silicon oxide based dielectric materials (e.g., PEOX, USG, PSG, BPSG, etc.) a simplified etching process (e.g., an etching process with a single etching chemistry) can be used to expose an selected lateral conductive structure 510 of metallization layer 508A. In addition, an over-etch process using $C_4F_8$ gas may be used to punch through liner layer 1102 and expose conductive structure 510. By way of example and not limitation, openings 1100 can have an aspect ratio between about 1.2 and about 2, and a sidewall angle θ between about 75° and about 85° (e.g., about 75°, about 78°, about 80°, about 82°, about 83°, and about 85°).

According to some embodiments, the use of the sacrificial isolation region 400 and an oxide-based stack (e.g., oxide layer 900 and dielectric layer 514)—as opposed to a combination of oxide layers and nitride etch-stop layers—simplifies the etching process in terms of etching chemistry and required number of etching operations, and provides openings 1100 with substantially vertical sidewalls (e.g., between about 75° and about 85°). Further, an oxide-based stack, due to its homogeneity, reduces the mechanical stress induced to the pad structure and mitigates stress related failures in the vicinity of the pad structure.

In referring to FIG. 14B, method 1400 continues with operation 1412 and the formation of a pad structure in the openings. By way of example and not limitation, a pad structure according to operation 1412 of method 1400 is pad structure 1300 shown in FIG. 13. Pad structure 1300 can be formed by depositing and patterning a metal layer. In some embodiments, the pad structure includes a metal alloy (e.g., aluminum-copper (AlCu)), another suitable metal, or an alloy.

Method 1400 concludes with operation 1414, where a dielectric layer is deposited on the pad structure and an opening is formed in the dielectric layer to expose a portion of the pad structure. In some embodiments, an example of the opening described in operation 1414 is opening 1304 shown in FIG. 13. By way of example and not limitation, a wire connector can be formed in opening to electrically connect the metallization layers of the image sensor to external components or devices, such as other chips, power supplies, etc.

Various embodiments in accordance with this disclosure describe the formation of a pad structure in an image sensor device (e.g., a BSI image sensor device) using a sacrificial isolation region and a silicon oxide based stack with no intervening nitride etch-stop layers (e.g., silicon nitride layers). In some embodiments, the silicon oxide based stack—in which the pad structure openings are formed— includes dielectric materials, such as silicon oxide, USG, PSG, BPSG, PEOX FSG, a low-k dielectric material, or combinations thereof that simplify the etching process in terms of etching chemistry and number of etching operations. Further, the oxide-based stack, due to its homogeneity, reduces the mechanical stress induced to the pad structure and mitigates stress related failures in the vicinity of the pad structure. In some embodiments, the resulting pad structure openings have substantially vertical sidewalls (e g., between about 75° and about 85°).

In some embodiments, an image sensor device includes a semiconductor layer comprising a first horizontal surface that is opposite to a second horizontal surface; a metallization layer formed on the second horizontal surface of the semiconductor layer, where the metallization layer includes a dielectric layer. The image sensor device also includes one or more radiation sensing regions formed in the semiconductor layer and a pad region traversing through the semiconductor layer from the first horizontal surface to the second horizontal surface. The pad region includes an oxide layer with no intervening nitride layers formed on the dielectric layer of the metallization layer and a pad structure, in physical contact with a conductive structure of the metallization layer, traversing through the oxide layer and the dielectric layer of the metallization layer.

In some embodiments, a method includes forming an isolation region in a first surface of a semiconductor layer and a device layer on the first surface of the semiconductor layer, where the device layer includes a nitride layer in contact with the isolation region and a dielectric layer on the nitride layer. The method further includes forming a metallization layer on the device layer and a pad structure from a second surface of the semiconductor layer opposite to the first surface, where forming the pad structure includes: (i) etching the second surface of the semiconductor layer to form an opening that exposes the isolation region; (ii) removing the isolation region and the nitride layer of the device layer to expose the dielectric layer of the device layer; (iii) depositing an oxide layer on the exposed dielectric layer; (iv) forming openings in the oxide layer and the dielectric layer to expose a conductive structure from the metallization layer; and (v) depositing a conductive material in the openings to form the pad structure.

In some embodiments an image sensor includes a semiconductor layer with an array of radiation sensing structures; a device layer disposed on a first surface of the semiconductor layer; a multilevel metallization layer disposed on the device layer; a pad array located at a perimeter region of the semiconductor layer and formed in a second surface of the semiconductor layer opposite to the first surface, where the pad array comprises pad structures. Further, the image sensor includes an oxide structure below each of the pad structures that includes a buffer oxide layer and a dielectric layer of the device layer, where portions of each of the pad structures traverse through the oxide structure to electrically connect to a conductive structure in the multilevel metallization layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. An image sensor device, comprising: a semiconductor layer comprising one or more radiation sensing regions; a metallization layer formed on a horizontal surface of the semiconductor layer and comprising a dielectric layer; a nitride layer formed between the metallization layer and horizontal surface of the semiconductor layer at the one or more radiation sensing regions, and a pad region traversing through the semiconductor layer, wherein the pad region comprises: an oxide layer, wherein a bottom surface of the oxide layer is in physical contact with the top surface of the dielectric layer and without being in physical contact with the nitride layer at an interface between the oxide layer and the dielectric layer; and a pad structure traversing through the oxide layer and the dielectric layer of the metallization layer and in physical contact with a conductive structure of the metallization layer, wherein the pad structure is located in an opening of the semiconductor layer and surrounded by the oxide layer.

2. The image sensor device of claim 1, wherein the oxide layer has a thickness between about 100 nm and about 700 nm and comprises silicon oxide, undoped silicate glass (USG), phosphosilicate glass (PSG), borophosphosilicate glass (BPSG), fluorine-doped silicate glass (FSG), or combinations thereof.

3. The image sensor device of claim 1, wherein the oxide layer comprises polyethyloxazoline (PEOX) and has a thickness between about 100 nm and about 700 nm.

4. The image sensor device of claim 1, wherein the pad region and the one or more radiation sensing regions are disposed in different regions of the image sensor device.

5. The image sensor device of claim 1, wherein the one or more radiation sensing regions are located at a center portion of the image sensor device and the pad region is located at a perimeter of the image sensor device.

6. The image sensor device of claim 1, further comprising: isolation regions disposed between the one or more radiation sensing regions;

a device layer disposed between the metallization layer and the second horizontal surface of the semiconductor layer; and an application specific integrated circuit (ASIC) electrically and mechanically connected to the metallization layer so that the metallization layer is interposed between the ASIC and the device layer.

7. An image sensor, comprising:

a semiconductor layer comprising an array of radiation sensing structures;

a device layer disposed on a bottom surface of the semiconductor layer and comprising a dielectric layer;

a multilevel metallization layer disposed below the device layer;

a pad array located at a perimeter region of the semiconductor layer and formed on a top surface of the semiconductor layer opposite to the bottom surface, wherein the pad array comprises pad structures; and an oxide structure below each of the pad structures and comprising a buffer oxide layer, wherein:

a bottom surface of the buffer oxide layer is in physical contact with a top surface of the dielectric layer; and portions of each of the pad structures traverse through the buffer oxide layer to electrically connect to a conductive structure in the multilevel metallization layer;

each of the pad structures is located in an opening of the semiconductor layer and surrounded by the buffer oxide layer; and the buffer oxide layer is not in physical contact with a nitride layer at an interface between the buffer oxide layer and the dielectric layer.

8. The image sensor of claim 7, wherein the buffer oxide layer comprises polyethyloxazoline (PEOX), undoped silicate glass (USG), phosphosilicate glass (PSG), borophosphosilicate glass (BPSG), fluorine-doped silicate glass (FSG), or combinations thereof.

9. The image sensor of claim 7, wherein the oxide structure does not comprise a nitride layer.

10. The image sensor of claim 7, wherein the dielectric layer of the device layer comprises a silicon oxide based material.

11. The image sensor of claim 7, wherein the buffer oxide layer has a thickness between about 100 nm and about 700 nm.

12. An image sensor device, comprising:

a semiconductor layer with a first horizontal surface opposite to a second horizontal surface;

an interconnect layer disposed below the second horizontal surface of the semiconductor layer, wherein the interconnect layer comprises conductive structures embedded in a dielectric layer;

radiation sensing regions in the semiconductor layer, wherein the radiation sensing regions are adjacent to the second horizontal surface of the semiconductor layer; and a pad region traversing through the semiconductor layer from the first horizontal surface to the second horizontal surface, wherein the pad region comprises:

an oxide layer comprising a third horizontal surface formed in physical contact with a fourth horizontal surface of the dielectric layer, wherein the oxide layer is not in physical contact with a nitride layer at an interface between the oxide layer and the dielectric layer; and a metal structure traversing through the oxide layer and the dielectric layer, wherein the metal structure is in physical contact with a conductive structure in the interconnect layer, located in an opening of the semiconductor layer, and surrounded by the oxide layer.

13. The image sensor device of claim 12, wherein the radiation sensing regions are separated from the dielectric layer by the nitride layer.

14. The image sensor device of claim 12, wherein the pad region is disposed adjacent to the radiation sensing regions.

15. The image sensor device of claim 12, wherein the oxide layer surrounds a portion of the metal structure.

16. The image sensor device of claim 15, wherein the oxide layer has at least one non-planar surface.

17. The image sensor device of claim 15, wherein the oxide layer is taller than the metal structure.

18. The image sensor device of claim 15, wherein the oxide layer comprises polyethyloxazoline (PEOX), undoped silicate glass (USG), phosphosilicate glass (PSG), borophosphosilicate glass (BPSG), fluorine-doped silicate glass (FSG), or combinations thereof.

19. The image sensor device of claim 12, wherein the metal structure comprises sidewall surfaces with a sidewall angle between about 75° and about 85°.

20. The image sensor device of claim 12, wherein a portion of the oxide layer is surrounded by the metal structure and the dielectric layer of the interconnect layer.

* * * * *